(12) United States Patent
Chen et al.

(10) Patent No.: US 11,264,383 B2
(45) Date of Patent: Mar. 1, 2022

(54) FIN FIELD EFFECT TRANSISTOR (FINFET) DEVICE STRUCTURE WITH CAPPING LAYER AND METHOD FOR FORMING THE SAME

(71) Applicant: TAIWAN SEMICONDUCTOR MANUFACTURING COMPANY, LTD., Hsinchu (TW)

(72) Inventors: Chun-Han Chen, Changhua (TW); Chen-Ming Lee, Yangmei (TW); Fu-Kai Yang, Hsinchu (TW); Mei-Yun Wang, Chupei (TW); Jr-Hung Li, Chupei (TW); Bo-Cyuan Lu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/024,006

(22) Filed: Sep. 17, 2020

(65) Prior Publication Data

US 2021/0005602 A1 Jan. 7, 2021

Related U.S. Application Data

(63) Continuation of application No. 16/596,209, filed on Oct. 8, 2019, now Pat. No. 10,797,050, which is a continuation of application No. 15/821,970, filed on Nov. 24, 2017, now Pat. No. 10,475,788.

(51) Int. Cl.
 *H01L 27/088* (2006.01)
 *H01L 21/8234* (2006.01)
 *H01L 29/423* (2006.01)
 *H01L 29/66* (2006.01)
 *H01L 29/78* (2006.01)

(52) U.S. Cl.
 CPC .. *H01L 27/0886* (2013.01); *H01L 21/823431* (2013.01); *H01L 29/42364* (2013.01); *H01L 29/42376* (2013.01); *H01L 29/66545* (2013.01); *H01L 29/7848* (2013.01)

(58) Field of Classification Search
 CPC .......... H01L 29/7851; H01L 27/10826; H01L 29/41791
 See application file for complete search history.

(56) References Cited

U.S. PATENT DOCUMENTS

| | | | |
|---|---|---|---|
| 10,475,788 B2 | 11/2019 | Chen et al. | |
| 2014/0197468 A1* | 7/2014 | Xie | H01L 29/6656 257/288 |
| 2015/0021712 A1 | 1/2015 | Zschaetzsch et al. | |
| 2015/0214367 A1* | 7/2015 | Chang | H01L 21/76802 257/401 |
| 2015/0255458 A1 | 9/2015 | Ando et al. | |
| 2016/0111425 A1* | 4/2016 | Chen | H01L 29/66545 257/369 |

(Continued)

*Primary Examiner* — Changhyun Yi
(74) *Attorney, Agent, or Firm* — Birch, Stewart, Kolasch & Birch, LLP

(57) ABSTRACT

A FinFET device structure is provided. The FinFET device structure includes a first gate structure formed over a fin structure, and a conductive layer formed over the first gate structure. The FinFET device structure includes a first capping layer formed over the conductive layer, and a top surface of the conductive layer is in direct contact with a bottom surface of the first capping layer.

20 Claims, 20 Drawing Sheets

(56) References Cited

U.S. PATENT DOCUMENTS

| | | |
|---|---|---|
| 2017/0077256 A1 | 3/2017 | Adusumilli et al. |
| 2017/0236821 A1 | 8/2017 | Kim et al. |
| 2017/0278747 A1* | 9/2017 | Adusumilli ........... H01L 23/485 |
| 2017/0317213 A1 | 11/2017 | Park et al. |
| 2018/0083002 A1* | 3/2018 | Kim .................. H01L 29/66795 |
| 2018/0083117 A1* | 3/2018 | Ando ................ H01L 29/66545 |

* cited by examiner

FIN FIELD EFFECT TRANSISTOR (FINFET) DEVICE STRUCTURE WITH CAPPING LAYER AND METHOD FOR FORMING THE SAME

CROSS REFERENCE TO RELATED APPLICATIONS

This application is a Continuation application of U.S. patent application Ser. No. 16/596,209, filed on Oct. 8, 2019, which is a Continuation application of U.S. patent application Ser. No. 15/821,970, filed on Nov. 24, 2017, now U.S. Pat. No. 10,475,788, issued Nov. 12, 2019, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A shows a cross-sectional representation taken along the line II' of FIG. 1G.

DETAILED DESCRIPTION

Figure 1A:
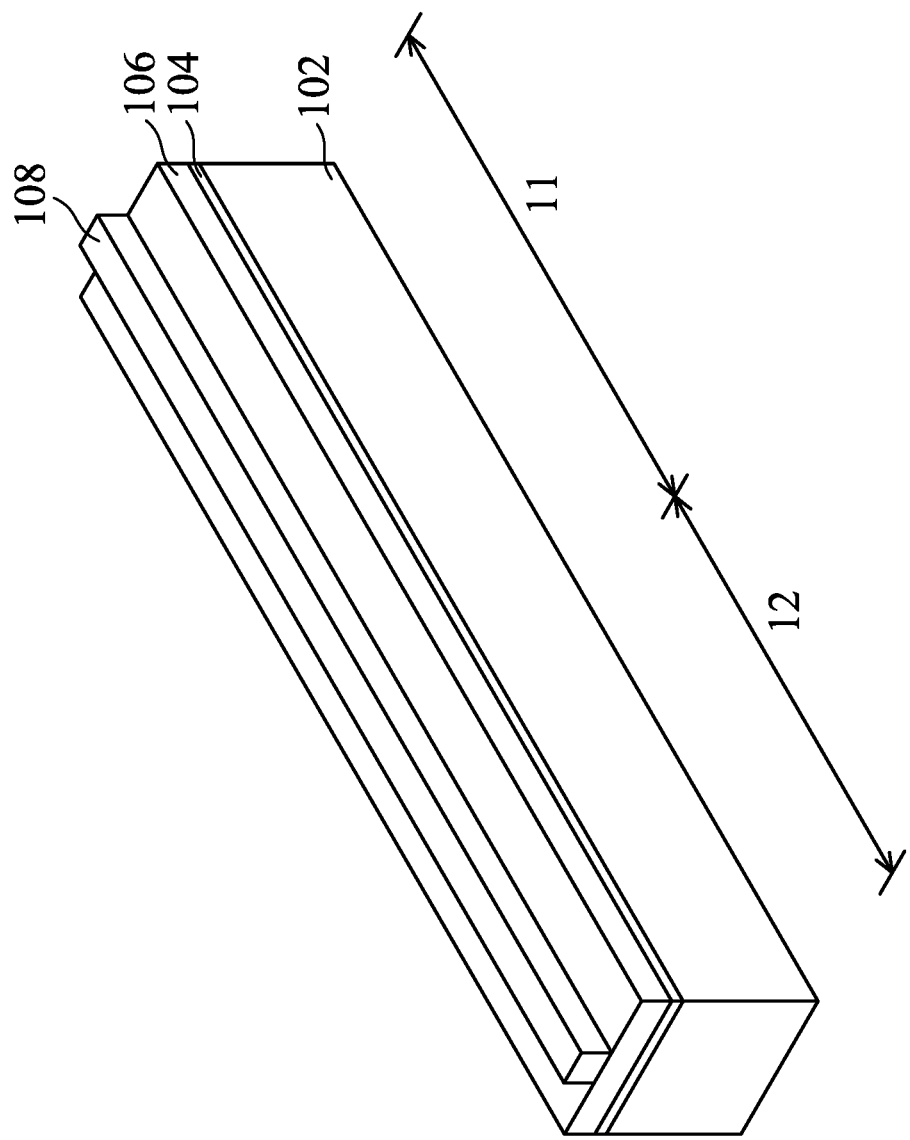
FIGS. 1A-1K show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1K show perspective representations of various stages of forming a FinFET device structure 100, in accordance with some embodiments of the disclosure.

Referring to FIG. 1A, a substrate 102 is provided. The substrate 102 includes a first region 11 and a second region 12. The first region 11 is used to form a first gate structure (formed later) with a long channel, and the second region 12 is used to form a second gate structure (formed later) with a short channel.

The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
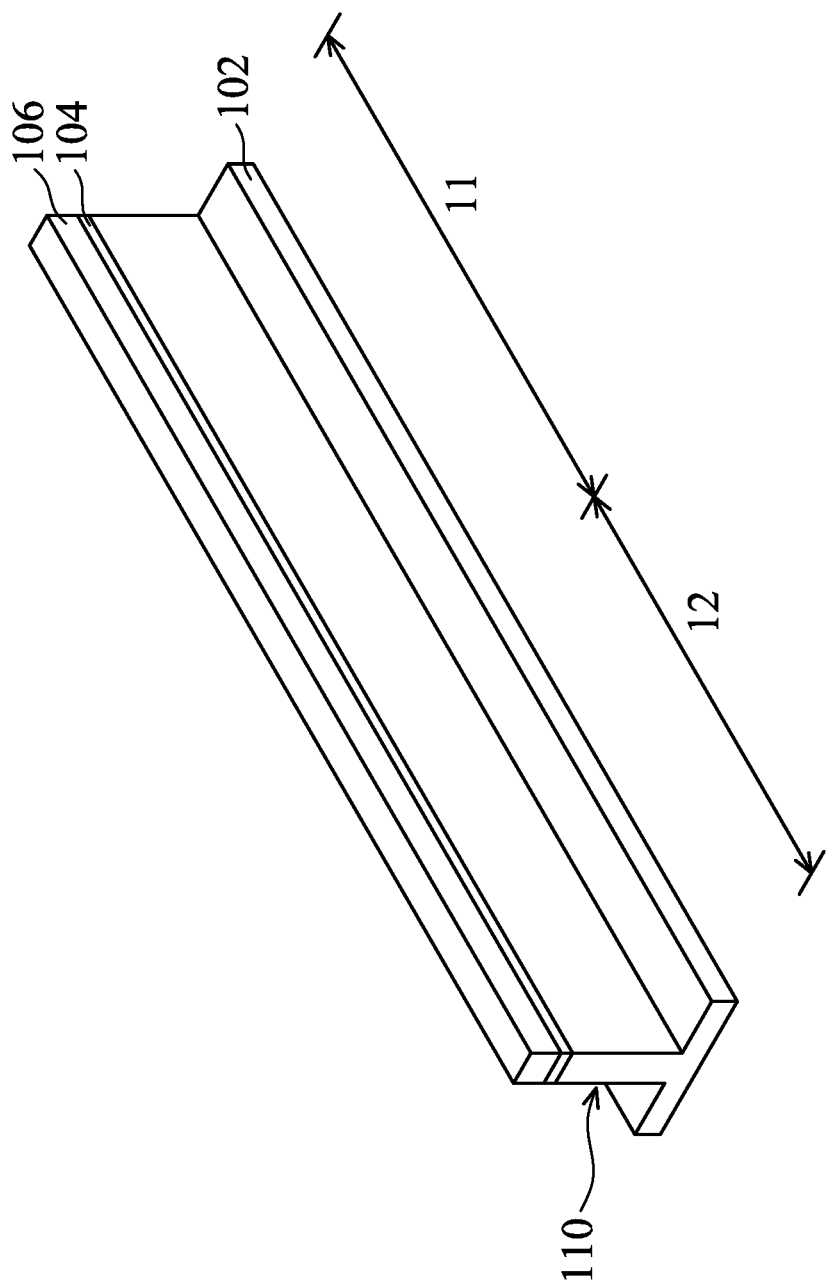

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
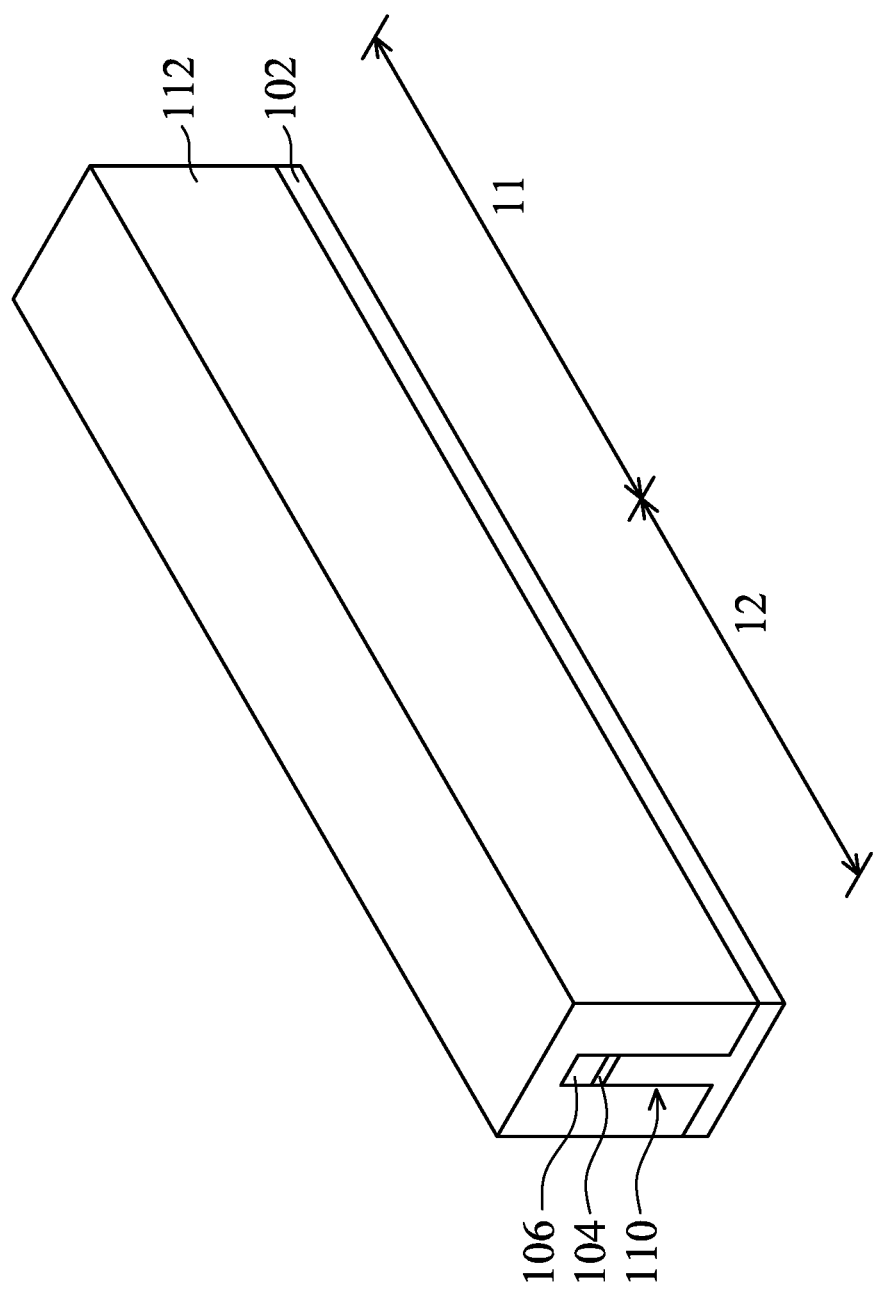

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process. Afterwards, the patterned dielectric layer 104 and the patterned mask layer 106 are removed.

Figure 1D:
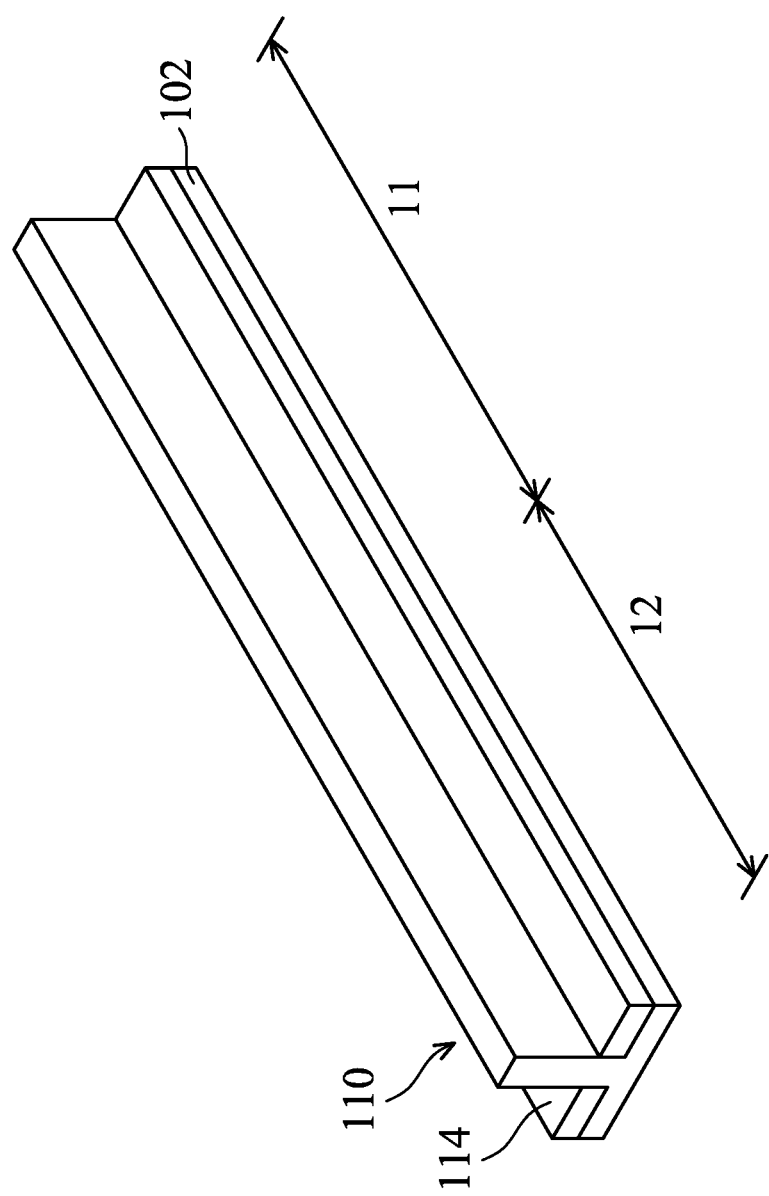

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

Figure 1E:
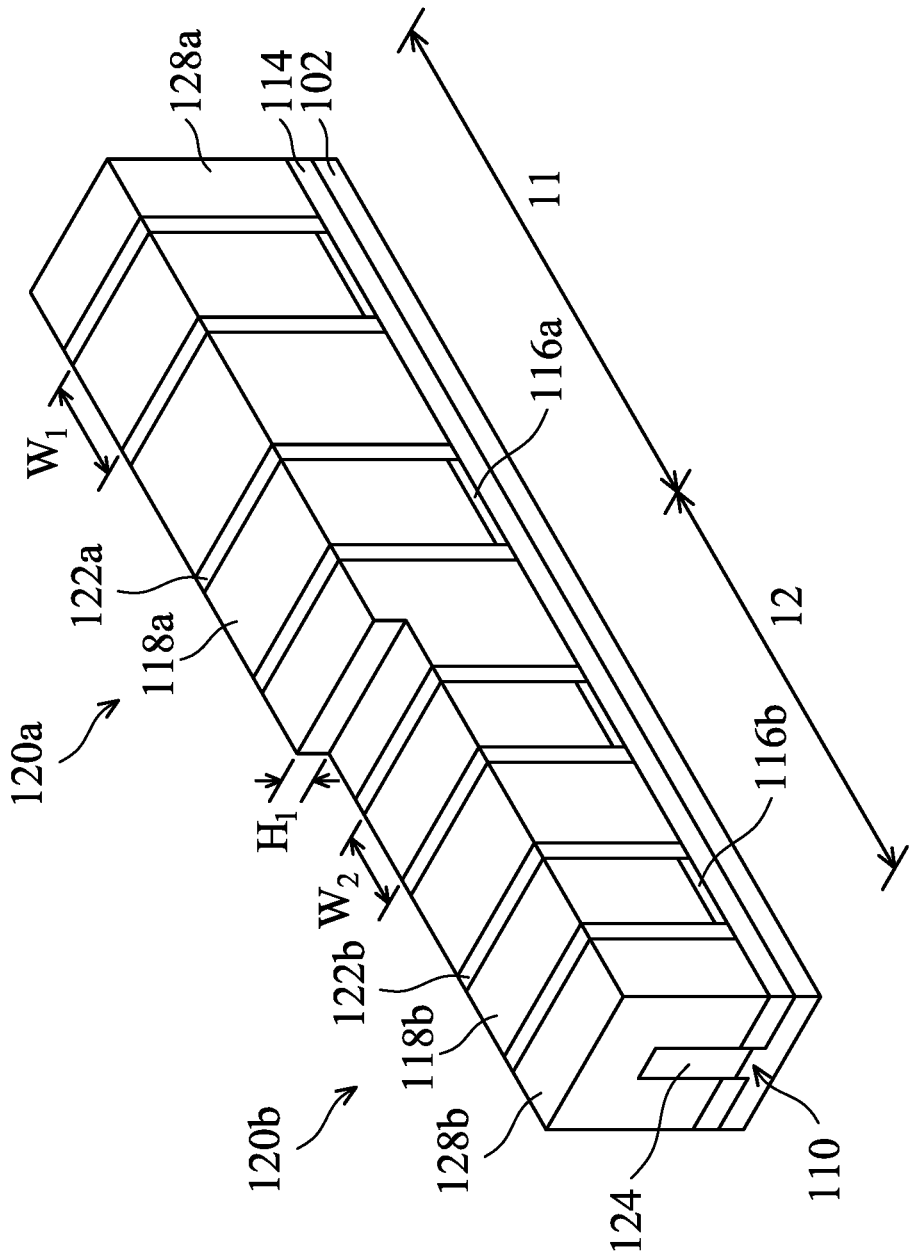

Afterwards, as shown in FIG. 1E, a first dummy gate structure 120a and a second dummy gate structure 120b are formed across the fin structure 110 and extends over the isolation structure 114, in accordance with some embodiments.

In some embodiments, the first dummy gate structure 120a includes a first dummy gate dielectric layer 116a, and a first dummy gate electrode layer 118a over the first dummy gate dielectric layer 116a. The second dummy gate structure 120b includes a second dummy gate dielectric layer 116b, and a second dummy gate electrode layer 118b over the second dummy gate dielectric layer 116b. After the first dummy gate structure 120a is formed, the first gate spacer layers 122a are formed on opposite sidewall surfaces of the first dummy gate structure 120a. The first gate spacer layers 122 may be a single layer or multiple layers. The second gate spacer layers 122b are formed on opposite sidewall surfaces of the second dummy gate structure 120b.

Afterwards, source/drain (S/D) structures 124 are formed over the fin structure 110. In some embodiments, portions of the fin structure 110 adjacent to the first dummy gate structure 120a and the second dummy gate structure 120b are recessed to form recesses at two sides of the fin structure 110, and a strained material is grown in the recesses by an epitaxial (epi) process to form the S/D structures 124. The S/D structures 124 are formed over the isolation structure 114.

In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like. The S/D structures 124 include a first S/D structure 124a (shown in FIG. 2A) adjacent to a first gate structure 140a (shown in FIG. 1G), and a second S/D structure 124b (shown in FIG. 2A) adjacent to a second gate structure 140b.

After the source/drain (S/D) structures 124 are formed, a contact etch stop layer (CESL) (not shown) is optionally formed over the substrate 102, and an inter-layer dielectric (ILD) layer 128 is formed over the contact etch stop layer 126. In some other embodiments, the CESL is made of silicon nitride, silicon oxynitride, and/or other applicable materials. The contact etch stop layer may be formed by plasma enhanced CVD, low-pressure CVD, ALD, or other applicable processes.

The ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 128 may be formed by chemical vapor deposition (CVD), physical vapor deposition, (PVD), atomic layer deposition (ALD), spin-on coating, or another applicable process.

Afterwards, a polishing process is performed on the ILD layer 128 until the top surface of the first dummy gate structure 120a and the top surface of the second dummy gate structure 120b is exposed. In some embodiments, the ILD layer 128 is planarized by a chemical mechanical polishing (CMP) process. The ILD layer 128 includes a first portion 128a in the first region 11 and a second portion 128b in the second region 12.

The first dummy gate structure 120a has a first width $W_1$ along a first direction, and the second dummy gate structure 120b has a second with $W_2$ along the first direction. The first direction is the growth direction of the fin structure 110. The first width $W_1$ is greater than the second width $W_2$. In some embodiments, the first width $W_1$ is in a range from about 20 nm to about 100 nm. In some embodiments, the second width $W_2$ is in a range from about 2 nm to about 10 nm.

For regions with different exposed areas (or etched areas), it is difficult to control etch uniformity due to the loading effect. Depending on the etching strategy, the loading effect is the etch rate for a larger area being either faster or slower than it is for a smaller area. In other words, the loading effect is that the etch rate in a large area is mismatched to the etch rate in a small area. This means that the loading effect may be affected by pattern density. It should be noted that the first width $W_1$ of the first dummy gate structure 120a is greater than the second width $W_2$ of the second dummy gate structure 120b, the first portion 128a of the ILD layer 128 in the first region 11 is higher than the second portion 128b of the ILD layer 128 in the second region 12 due to the loading effect. Therefore, there is a height gap $H_1$ between the first portion 128a and the second portion 128b of the ILD later 128 due to the loading effect. In some embodiments, the height gap $H_1$ is in arrange from about 15 nm to about 20 nm.

Figure 1F:
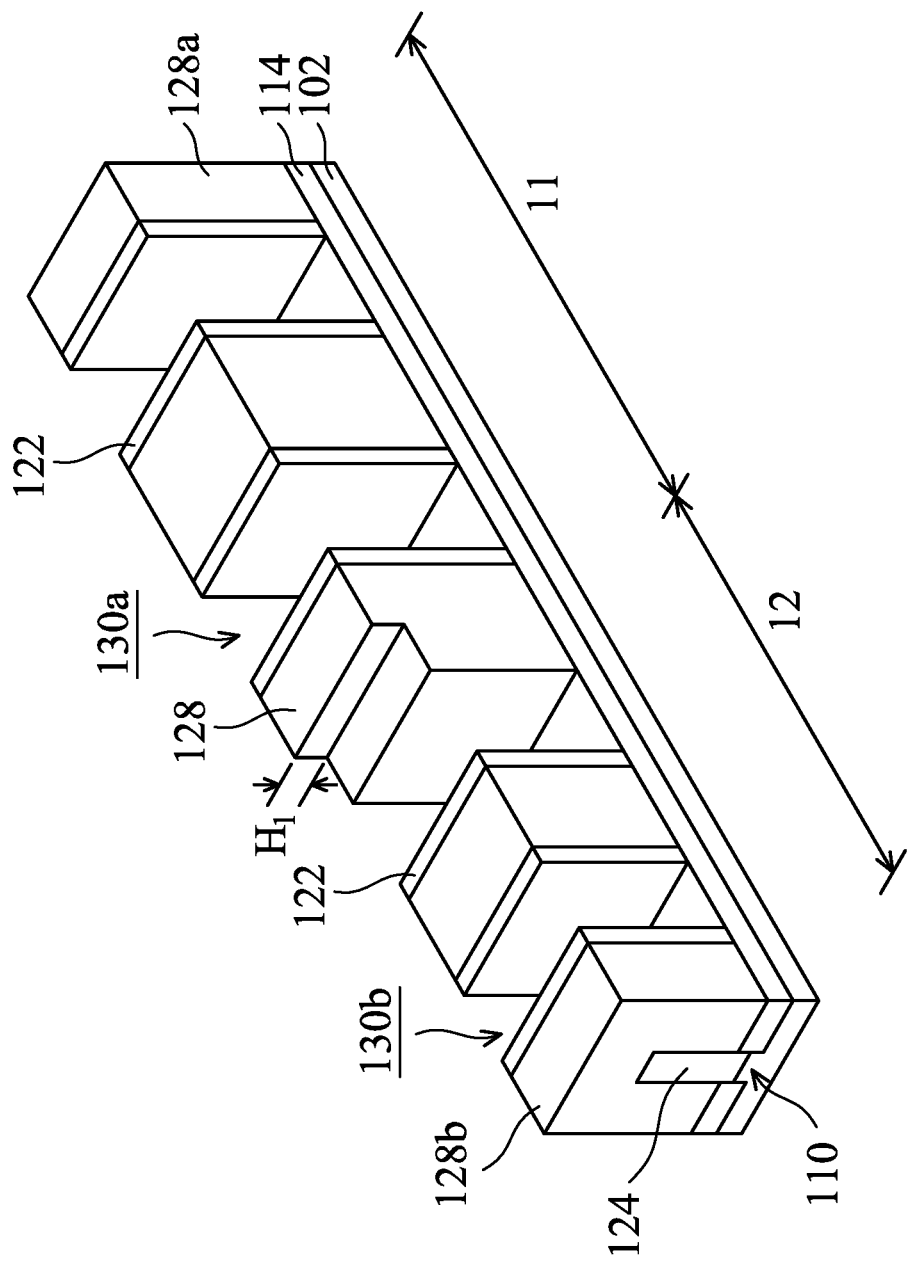

Afterwards, as shown in FIG. 1F, the first dummy gate structure 120a and the second dummy gate structure 120b are removed to form the first trenches 130a and the second trenches 130b in the ILD layer 128, in accordance with some embodiments. The first trenches 130a are formed in the first region 11, and the second trenches 130b are formed in the second region 12. The dummy gate dielectric layer 116 and the dummy gate electrode layer 118 are removed by an etching process, such as a dry etching process or a wet etching process.

Figure 1G:
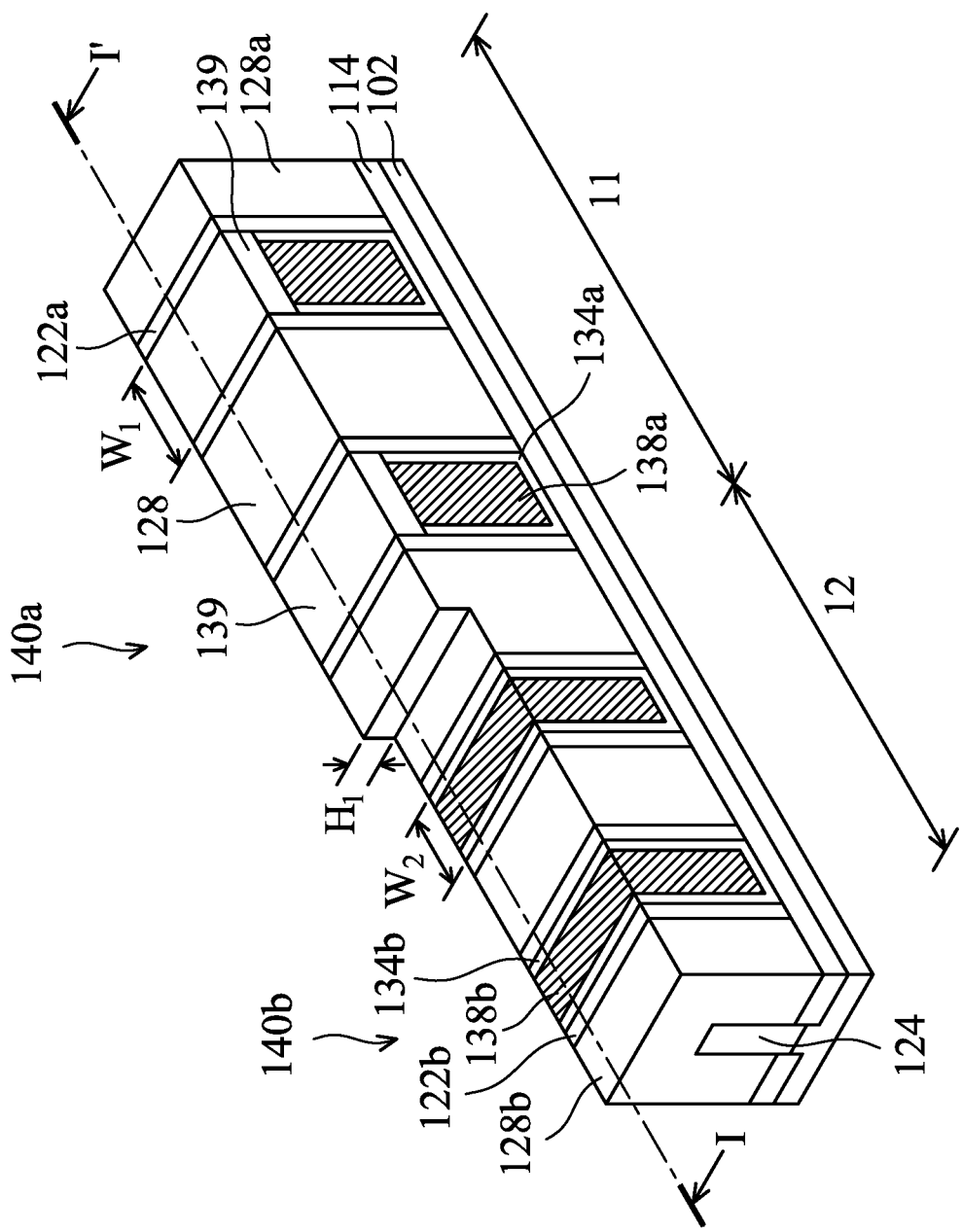

Next, as shown in FIG. 1G, a first gate structure 140a and a second gate structure 140b are formed in one of the first trenches 130a and one of the second trenches 130b, respectively, in accordance with some embodiments. The first gate structure 140a and a second gate structure 140b are formed on the isolation structure 114.

In the first region 11, the first gate structure 140a includes a first gate dielectric layer 134a, a first gate electrode layer 138a over the first gate dielectric layer 134a and a conductive layer 139 over the first gate electrode layer 138a. In the second region 12, the second gate structure 140b includes a second gate dielectric layer 134b and a second gate electrode layer 138b over the second gate dielectric layer 134b.

The conductive layer 139 is configured to reduce the resistance between a contact structure (formed above the conductive layer) and the first gate structure 140a. In some embodiments, the conductive layer 139 is made of low-resistance conductive material, such as tungsten (W) or molybdenum (Mo). It should be noted that no conductive layer is formed over the second gate dielectric layer 134b and the second gate electrode layer 138b because each of the second trenches 130b has a smaller width which is too small to be filled with other materials.

The first gate dielectric layer 134a and the second gate dielectric layer 134b may be a single layer or multiple layers. The first gate dielectric layer 134a and the second gate dielectric layer 134b are independently made of silicon oxide (SiOx), silicon nitride (SixNy), silicon oxynitride (SiON), dielectric material(s) with high dielectric constant (high-k), or a combination thereof. In some embodiments, the first gate dielectric layer 134a and the second gate dielectric layer 134b are deposited by a plasma enhanced chemical vapor deposition (PECVD) process or by a spin coating process.

The first gate electrode layer 138a and the second gate electrode layer 138b are independently made of conductive material, such as aluminum (Al), copper (Cu), tungsten (W), titanium (Ti), tantalum (Ta), or other applicable materials. The first gate electrode layer 138a and the second gate electrode layer 138b are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

The first gate structure 140a has a first width $W_1$ along a first direction, and the second gate structure 140b has a second with $W_2$ along the first direction. The first direction is the growth direction of the fin structure 110. The first width $W_1$ is greater than the second width $W_2$. In some embodiments, the first width $W_1$ is in a range from about 20 nm to about 100 nm. In some embodiments, the second width $W_2$ is in a range from about 2 nm to about 10 nm.

Figure 1H:
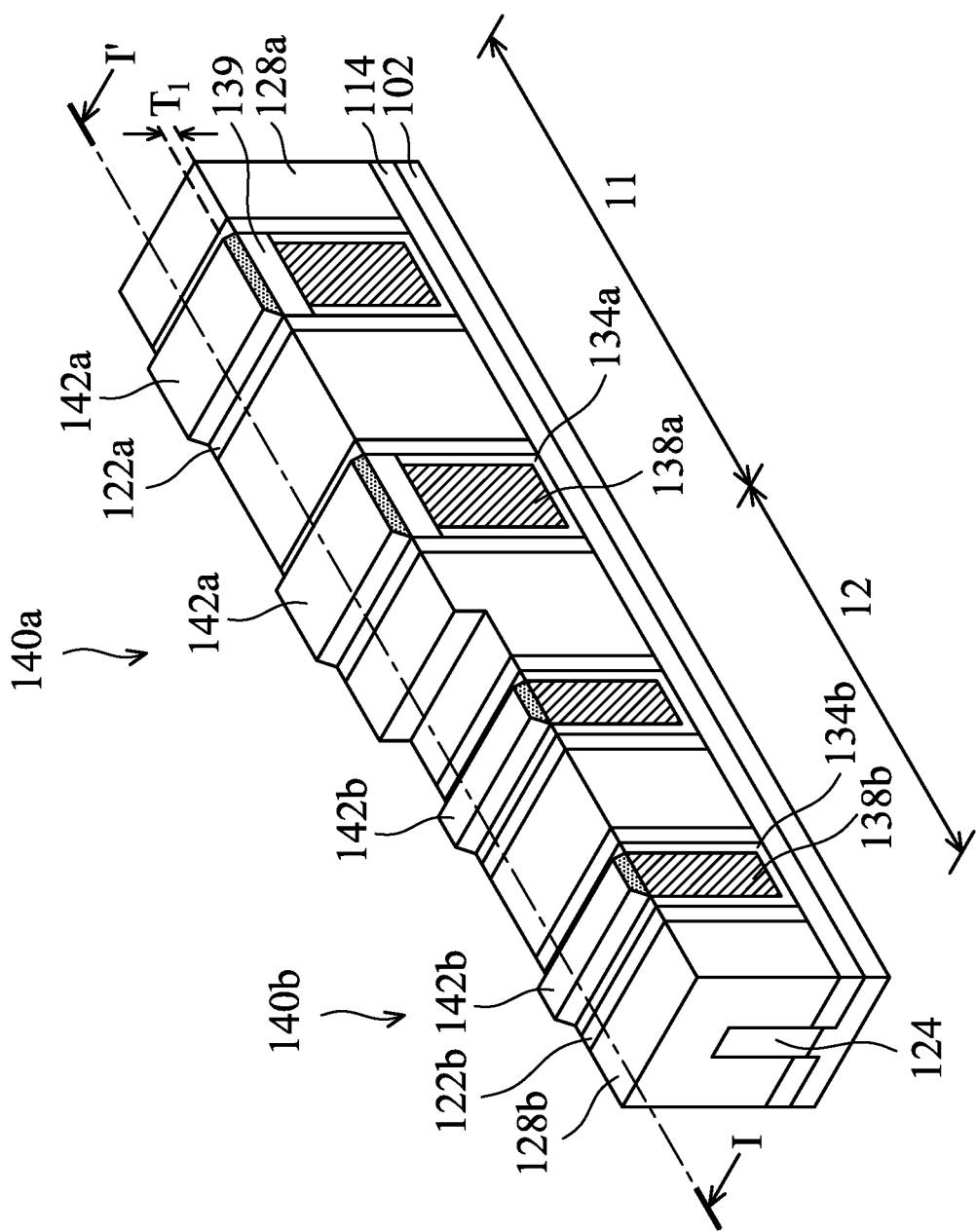

Next, as shown in FIG. 1H, a first capping layer 142a is formed over the first gate structure 140a and a second capping layer 142b is formed over the second gate structure 140b, in accordance with some embodiments. The first capping layer 142a and the second capping layer 142b are configured to prevent the underlying layers from being damaged by the subsequent processes. More specifically, the first capping layer 142a and the second capping layers 142b are used as a barrier to protect the underlying layers. In some embodiments, the bottom surface of the first capping layer 142a is substantially level with the top surface of the conductive layer 139. The term of "substantially" means that the reasonable deviations due to the manufacturing process.

More specifically, the first capping layer 142a and the second capping layer 142b are selectively formed on some regions. The first capping layer 142a is in direct contact with the top surface of the first gate structure 140a. More specifically, the first capping layer 142a is in direct contact with the top surface of the conductive layer 139.

In some embodiments, the first capping layer 142a is not formed on the first gate spacer layer 122a. In some embodiments, the first capping layer 142a is not formed on the first portion 128a of the ILD layer 128. The second capping layer 142b is in direct contact with the second gate electrode layer 138b. In some embodiments, the second capping layer 142b is not formed on the first gate spacer layer 122a. In some other embodiments, the second capping layer 142b is not formed on the second portion 128b of the ILD layer 128.

In some embodiments, the first capping layer 142a and the second capping layer 142b are made of silicon nitride (SixNy). In some embodiments, the first capping layer 142a and the second capping layer 142b are simultaneously formed by an ALD process. A precursor gas and an inhibitor gas are used in the ALD process. The precursor gas may include hexachlorodisilane (HCD), bis tertbutylamino silane (BTBAS), dichlorosilane (DCS, $SiH_2Cl_2$), disilane (DS), $SiH_4$, $NH_3$, $N_2$, or another suitable material. The inhibitor gas may include N-trimethylsilylpyrrole, octadecyltrichlorosilane (ODTS) or trimethylchrolosilane (TMCS). The inhibitor gas is used to react with the materials of the ILD layer 128 to form an inhibitor layer on the ILD layer 128.

The precursor gas for forming the capping layers 142a, 142b does not react with the inhibitor layer. As a result, the capping layers 142a, 142b are not formed on the ILD layer 128. The capping layers 142a, 142b are selectively formed on certain regions, such as on conductive layer 139, the second gate electrode layer 138b or the second gate dielectric layer 134b.

In some embodiments, before forming the capping layers 142a, 142b, a cleaning process is performed on the exposed top surfaces of the first gate structure 140a, the second gate structure 140b, the ILD layer 128, the first gate spacer layer 122a, and the second gate spacer layer 122b. In some embodiments, the cleaning process includes using hydrogen ($H_2$) gas and/or argon (Ar) gas. In some embodiments, the cleaning process is performed for about 5 minutes to about 15 minutes.

Since the top surface of the first gate structure 140a is higher than the top surface of the second gate structure 140b, the top surface of the first capping layer 142a is higher than the top surface of the second capping layer 142b. In addition, the first capping layer 142a is wider than the second capping layer 142b because the first gate structure 140a is wider than the second gate structure 140b. In some embodiments, the first capping layer 142a has a first thickness $T_1$ in a range from about 3 nm to about 5 nm. When the first thickness $T_1$ of the first capping layer 142a is within the above-mentioned range, the first capping layer 142a can provide sufficient protection for the underlying layers.

Figure 1I:
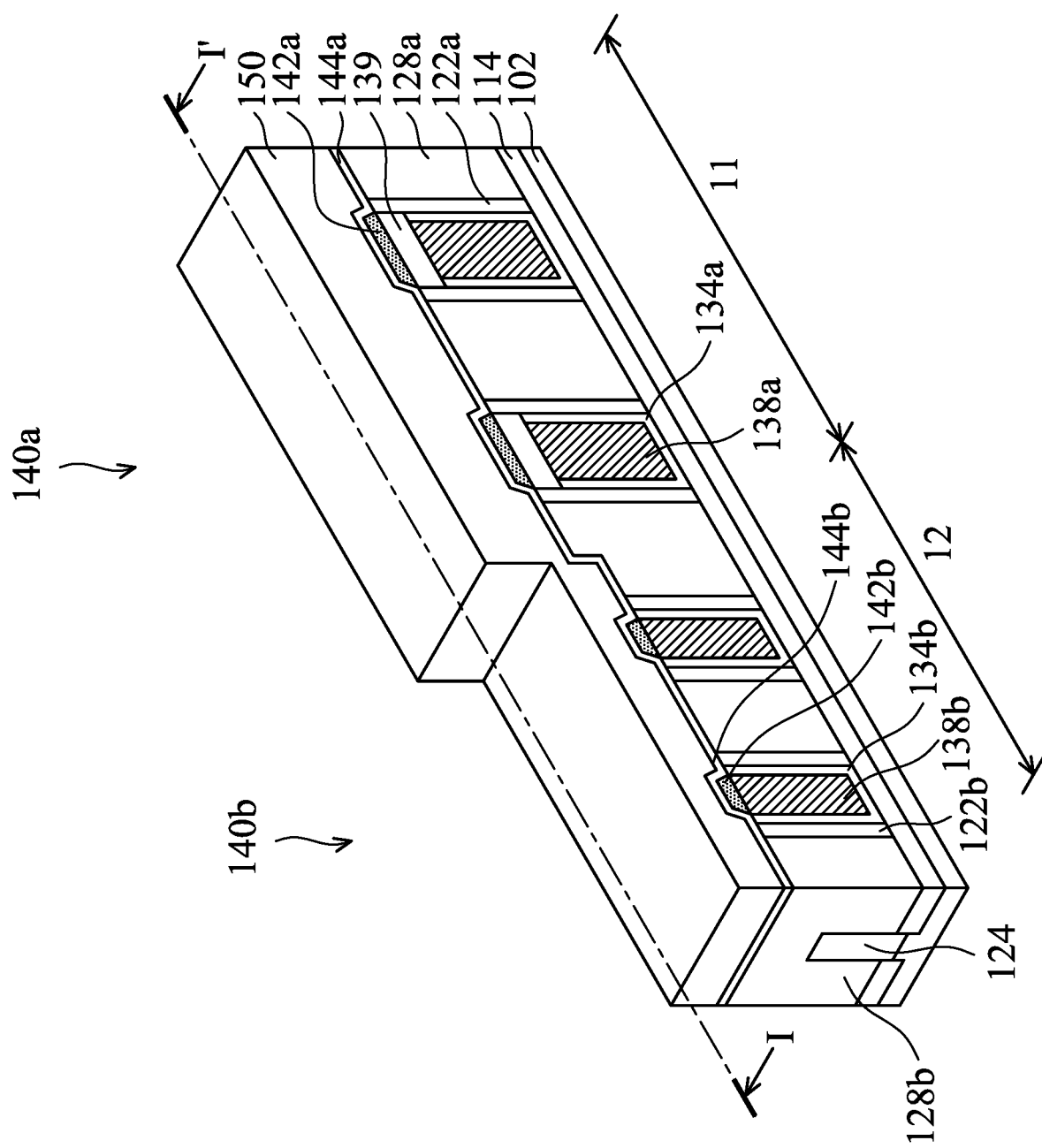

Afterwards, as shown in FIG. 1I, a first etching stop layer 144a is formed over the first capping layer 142a and the first gate structure 140a, and a second etching stop layer 144b is formed over the second capping layer 142b and the second gate structure 140b, in accordance with some embodiments. Next, a dielectric layer 150 is formed over the first etching stop layer 144a and the second etching stop layer 144b.

Since the first capping layer 142a is higher than the second capping layer 142b, and the first portion 128a of the ILD layer 128 is higher than the second portion 128b of the ILD layer 128, the first etching stop layer 144a in the first region 11 is higher than the second etching stop layer 144b in the second region 12. A portion of the first etching stop layer 144a which is directly above the first capping layer 142a is higher than another portion of the first etching stop layer 144a which is directly above the first gate spacer layer 122a.

The first etching stop layer 144a is conformally formed over the first capping layer 142a, the first gate spacer layer 122a and the first portion 128a of the ILD layer 128. Since the first capping layer 142a protrudes from the top surface of the first gate structure 140a, and a portion of the first etching stop layer 144a which is directly above the first capping layer 142a is higher than another portion of the first etching stop layer 144a. Similarly, the second etching stop layer 144b is conformally formed over the second capping layer 142a, the second gate spacer layer 122b and the second portion 128b of the ILD layer 128. Since the second capping layer 142b protrudes from the top surface of the second gate structure 140b, and a portion of the second etching stop layer 144b which is directly above the second capping layer 142b is higher than another portion of the second etching stop layer 144b. A portion of the first etching stop layer 144a is higher than another portion of the first etching stop layer 144a. A portion of the second etching stop layer 144b is higher than another portion of the second etching stop layer 144b.

In some embodiments, the first capping layer 142a and the first etching stop layer 144a are made of the same material, such as silicon nitride (SixNy). In some embodiments, the second capping layer 142b and the second etching stop layer 144b are made of the same material, such as silicon nitride (SixNy). In some embodiments, the first etching stop layer 144a and the second etching stop layer 144b are simultaneously formed by performing a deposition process, such as chemical vapor deposition (CVD), physical vapor deposition, (PVD), atomic layer deposition (ALD), spin-on coating, or another applicable process. The dielectric layer 150 is made of may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials.

Figure 1J:
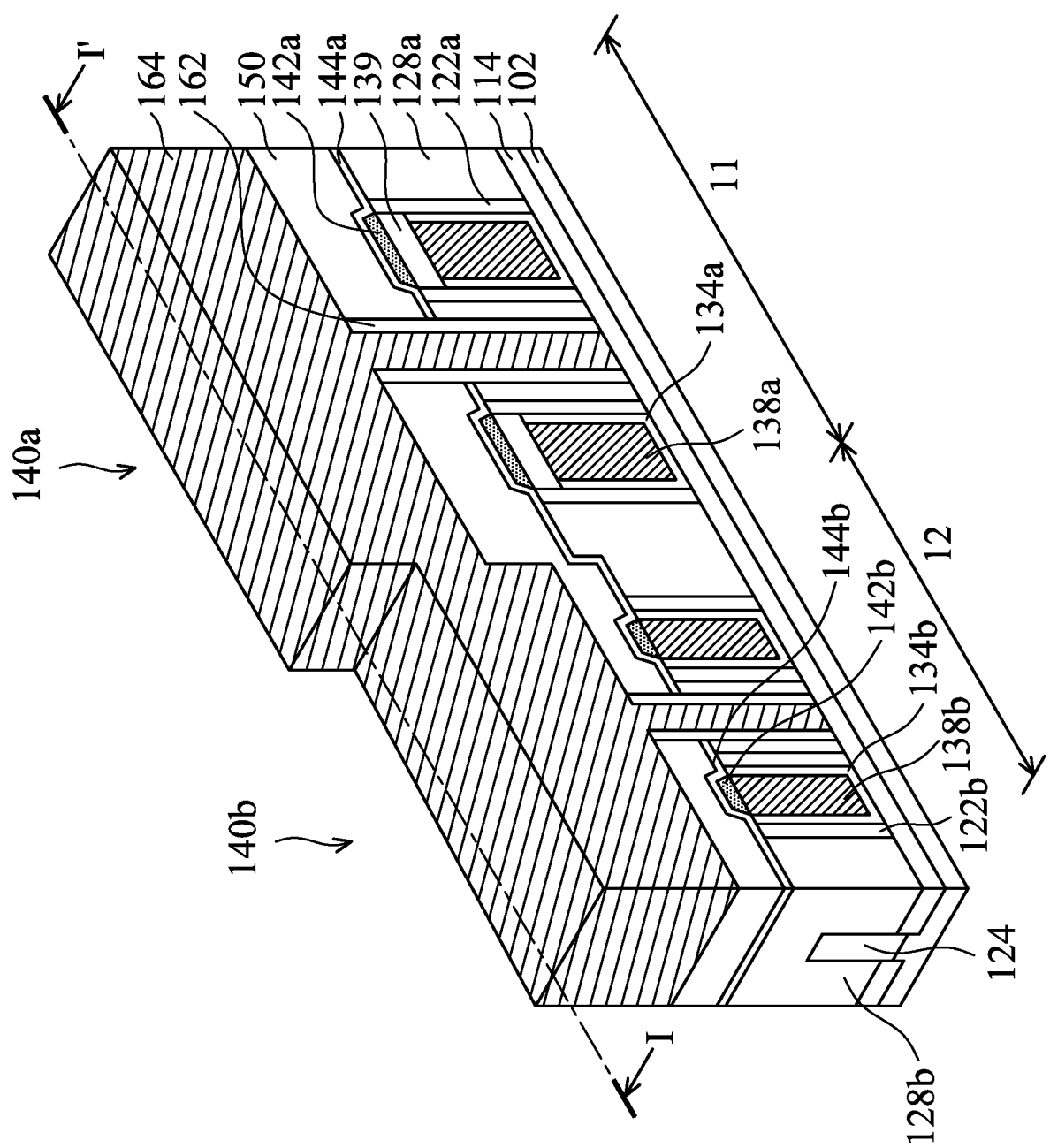

Afterwards, as shown in FIG. 1J, a number of trenches (not shown) are formed through the dielectric layer 150, the etching stop layers 144a, 144b, the ILD layer 128, and a barrier layer 162 is formed on sidewall surfaces of each of the trenches, in accordance with some embodiments. Subsequently, a conductive layer 164 is formed over the barrier layer 162 and dielectric layer 150.

The barrier layer 162 is used to separate the conductive layer 164 from the ILD layer 128. In some embodiments, the barrier layer 162 is made of Ti/TiN. In some embodiments, the barrier layer 162 is formed by a chemical vapor deposition (CVD) process, a physical vapor deposition (PVD) process, or other applicable process.

Figure 2A:
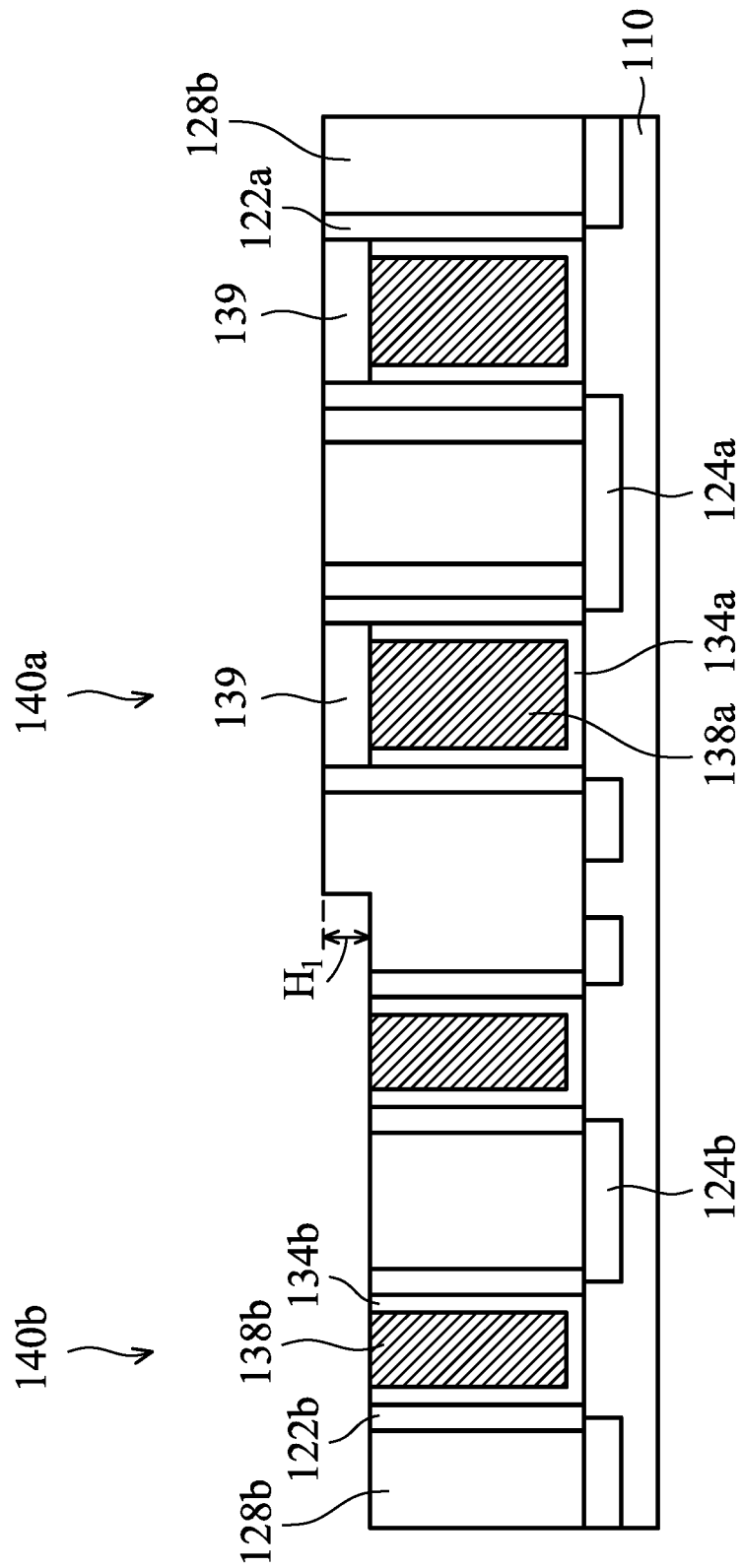
FIGS. 2A-2E show cross-sectional representations of various stages of forming a FinFET device structure shown in FIG. 1G-1K, in accordance with some embodiments of the disclosure.
Figure 2B:
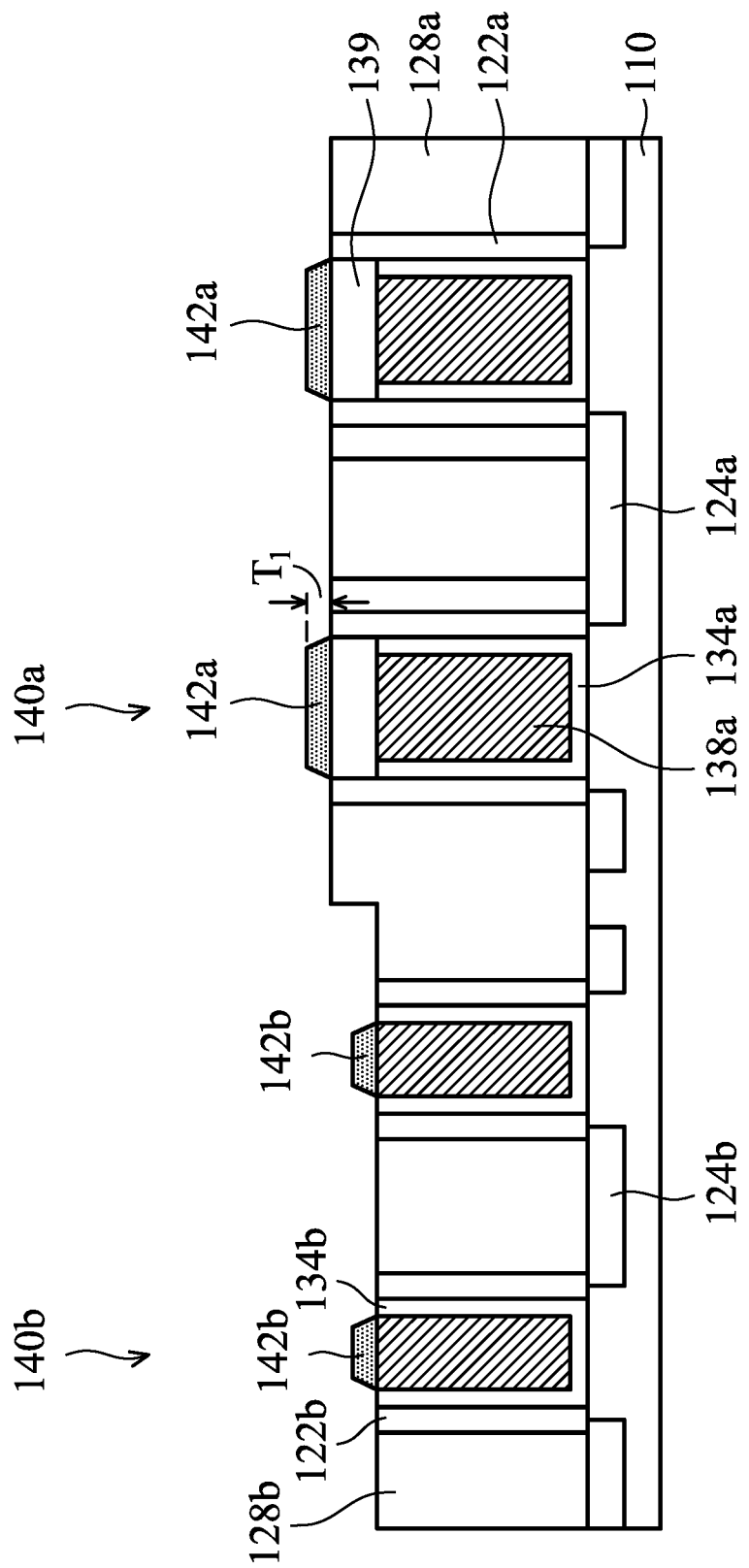
Figure 2C:
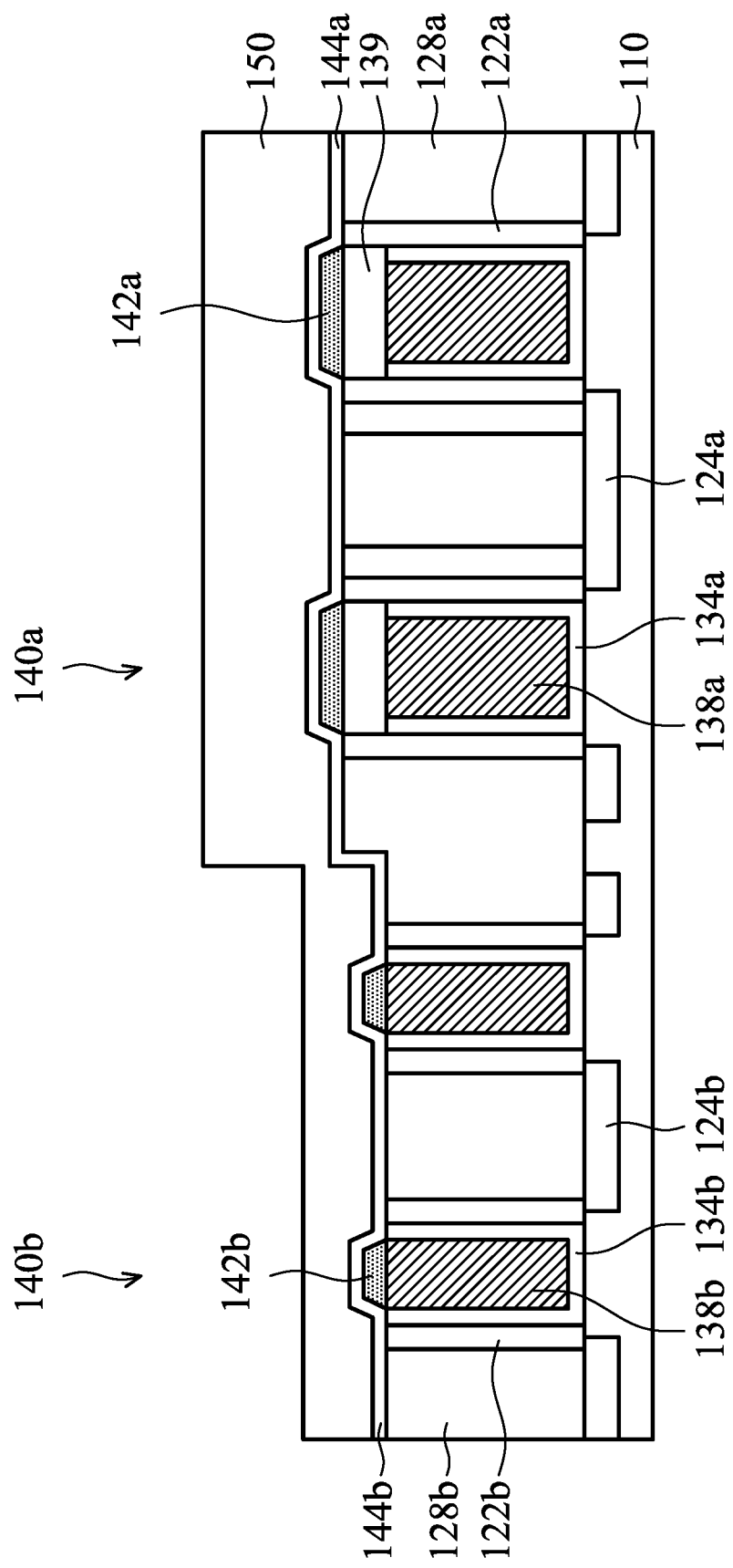
Figure 2D:
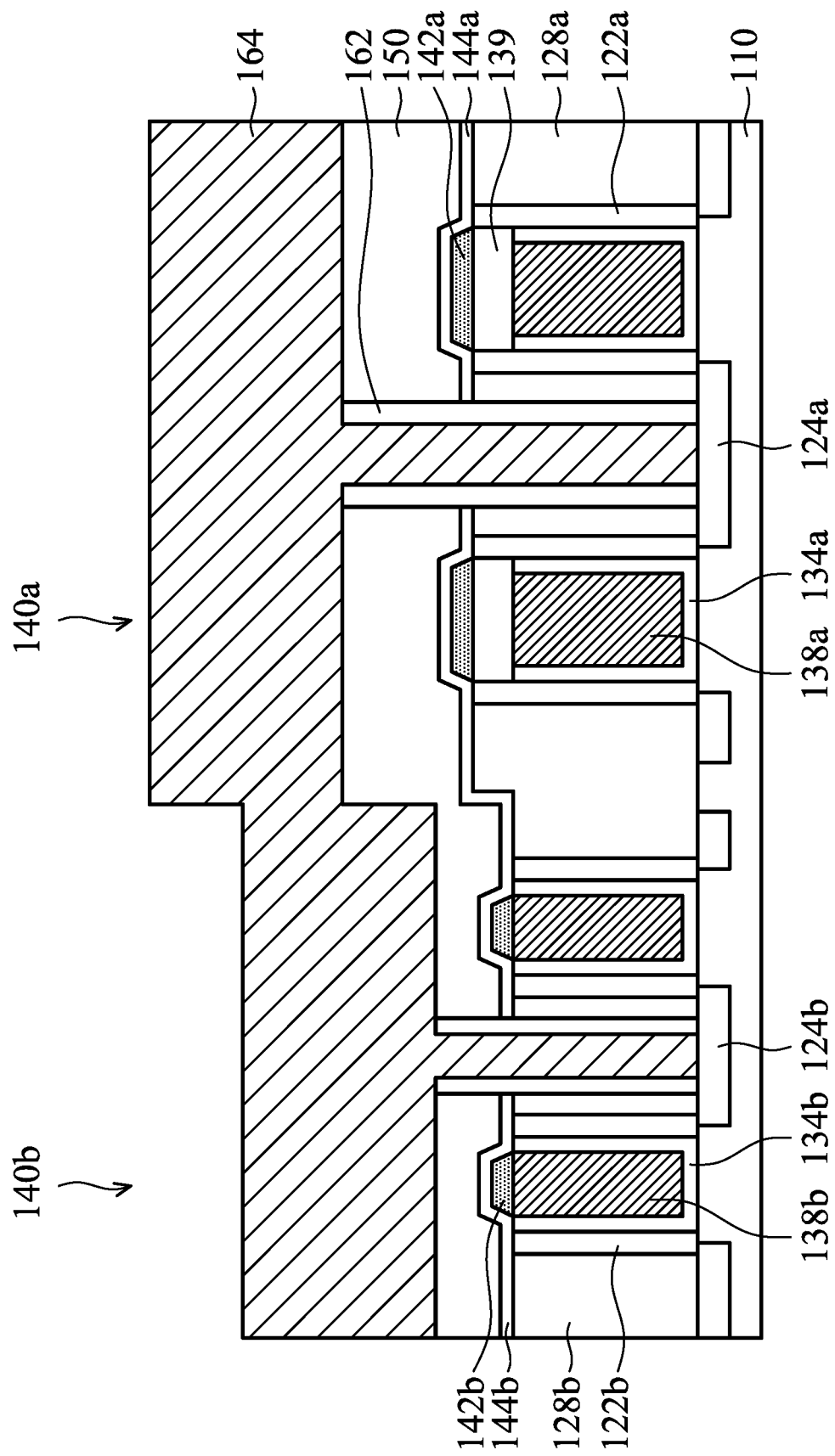

The conductive layer 164 is used to electrically connect to the S/D structure 124 (shown in FIG. 2D). In some embodiments, the conductive layer 164 is made of low-resistance material, such as tungsten (W), cobalt (Co), titanium (Ti), nickel (Ni), tantalum (Ta), hafnium (Hf), zirconium (Zr), platinum (Pt) or molybdenum (Mo). In some embodiments, the conductive layer 164 is formed by a chemical vapor deposition (CVD) process, a physical vapor deposition (PVD) process or an electroplating process.

Figure 1K:
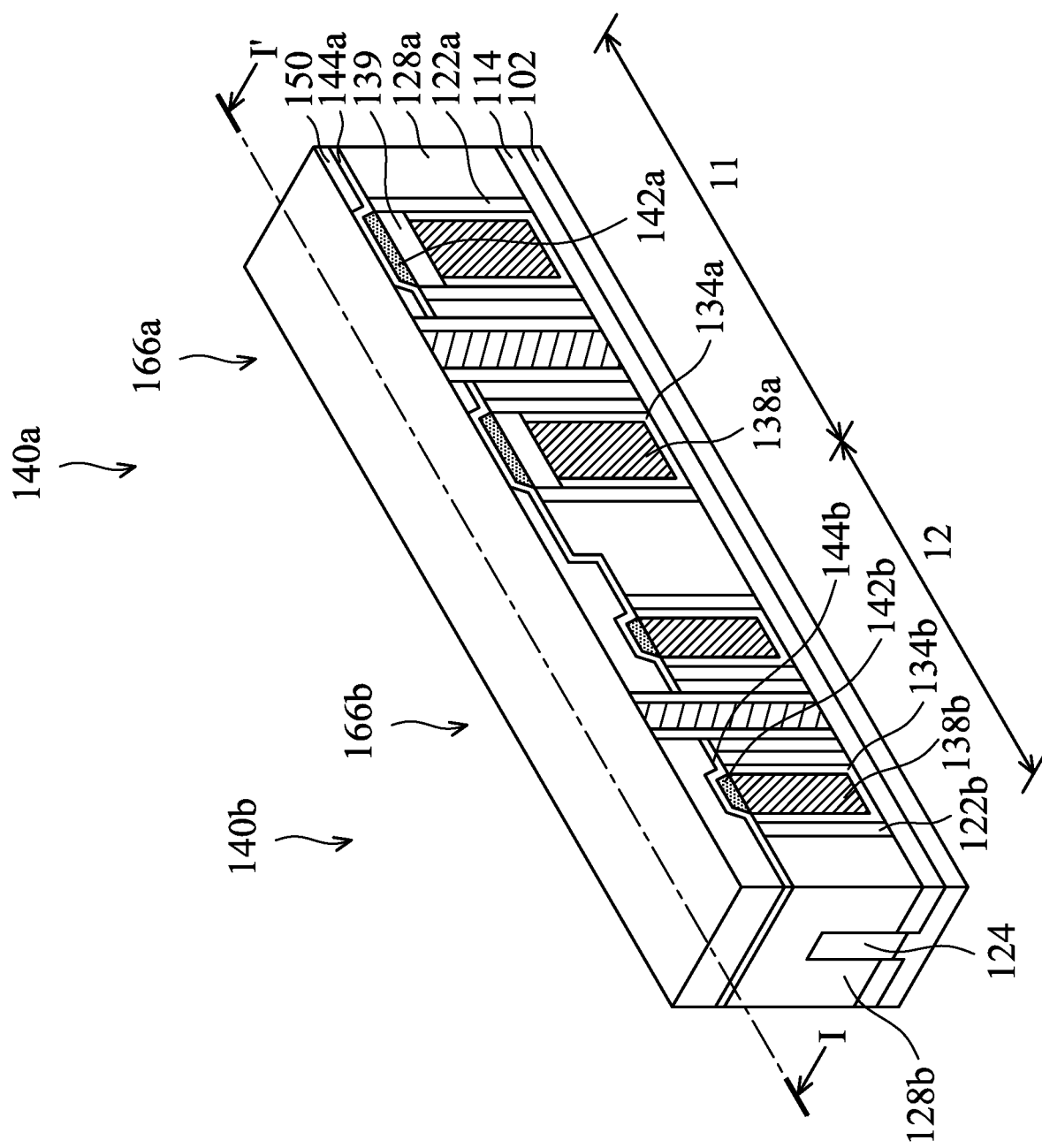

Next, as shown in FIG. 1K, a portion of the conductive layer 164 out of the trenches is removed, and a portion of the dielectric layer 150 is removed, in accordance with some embodiments. In some embodiments, the portion of the conductive layer 164 is removed by a polishing process, such as a chemical polishing mechanical (CMP) process. As a result, a first S/D contact structure 166a is formed in the first region 11, and a second S/D contact structure 166b is formed in the second region 12. The top surface of the first S/D contact structure 166a is substantially level with the top surface of the second S/D contact structure 166b. The first S/D contact structure 166a and the second S/D contact structure 166b are embedded in the dielectric layer 150.

As mentioned above, there is a height gap between the first etching stop layer 144a in the first region 11 and the second etching stop layer 144b in the second region 12. In other words, the first etching stop layer 144a in the first region 11 is higher than the second etching stop layer 144b in the second region 12. A first portion of the dielectric layer 150 in the first region 11 is also higher than a second portion of the dielectric layer 150 in the second region 12. The first portion of the dielectric layer 150 in the first region 11 is removed earlier than the second portion of the dielectric layer 150 in the second region 12.

When a CMP process is performed on the dielectric layer 150, the CMP process stops until the first etching stop layer 144a is exposed. However, although the first etching stop layer 144a is exposed, the first portion of the dielectric layer 150 is not level with the second portion of the dielectric layer 150. The CMP process continues until the first portion of the dielectric layer 150 is level with the second portion of the dielectric layer 150. As a result, the first etching stop layer 144a may be removed and the underlying layers may be removed. In some other embodiments, if no capping layer is formed over the conductive layer 139 to provide additional protection for the underlying layers (such as the conductive layer 139, the first gate dielectric layer 134a and the first gate electrode layer 138a), the underlying layers may be removed easily by the CMP process. The first capping layer 142a of the disclosure is configured to protect the conductive layer 139 and the first gate structure 140a when the CMP process is performed to planarize the dielectric layer 150.

It should be noted that a portion of the first etching stop layer 144a which is directly above the first capping layer 142a is substantially level with a top surface of the first S/D contact structure 166a, and another portion of the first etching stop layer 144a which is directly above the first portion of the ILD layer 128 is lower than the top surface of the first S/D contact structure 166a. The first capping layer 142a is selectively formed over the conductive layer 139 to protect the underlying layers from being damaged when the CMP process is performed to level with the dielectric layer 150 in the first region 11 and the second region 12. Furthermore, since the first capping layer 142a and the second capping layer 142b are selectively formed on some regions, no removal process or photolithography process is used to pattern the first capping layer 142a and the second capping layer 142b. Therefore, the fabrication time and cost are reduced.

FIGS. 2A-2E show cross-sectional representations of various stages of forming a FinFET device structure shown in FIG. 1G-1K, in accordance with some embodiments of the disclosure. FIG. 2A shows a cross-sectional representation taken along the line II' of FIG. 1G.

As shown in FIG. 2A, the source/drain (S/D) structures 124 are formed over the fin structure 110. The S/D structures 124 include a first S/D structure 124a in the first region 11 and a second S/D structure 124b in the second region 12.

Afterwards, as shown in FIG. 2B, the first capping layer 142a is selectively formed on the top surface of the conductive layer 139 in the first region 11, and the second capping layer 142b is selectively formed on the top surface of the second gate electrode layer 138b, in accordance with some embodiments of the disclosure. The first capping layer 142a is higher than the second capping layer 142b since the top surface of the conductive layer 139 is higher than the top surface of the second gate electrode layer 138b.

Next, as shown in FIG. 2C, the first etching stop layer 144a is formed over the first capping layer 142a and over the first portion 128a of the ILD layer 128, the second etching stop layer 144b is formed over the second capping layer 142b and over the second portion of the ILD layer 128, in accordance with some embodiments of the disclosure. Subsequently, the dielectric layer 150 is formed over the first etching stop layer 144a and the second etching stop layer 144b. Since the first capping layer 142a is higher than the second capping layer 142b, the first portion of the dielectric layer 150 is higher than the second portion of the dielectric layer 150.

Afterwards, as shown in FIG. 2D, a number of trenches (not shown) are formed through the dielectric layer 150, the etching stop layers 144a, 144b, the ILD layer 128, and the barrier layer 162 is formed on sidewalls of each of the trenches, in accordance with some embodiments. Subsequently, the conductive layer 164 is formed over the barrier layer 162 and dielectric layer 150.

Figure 2E:
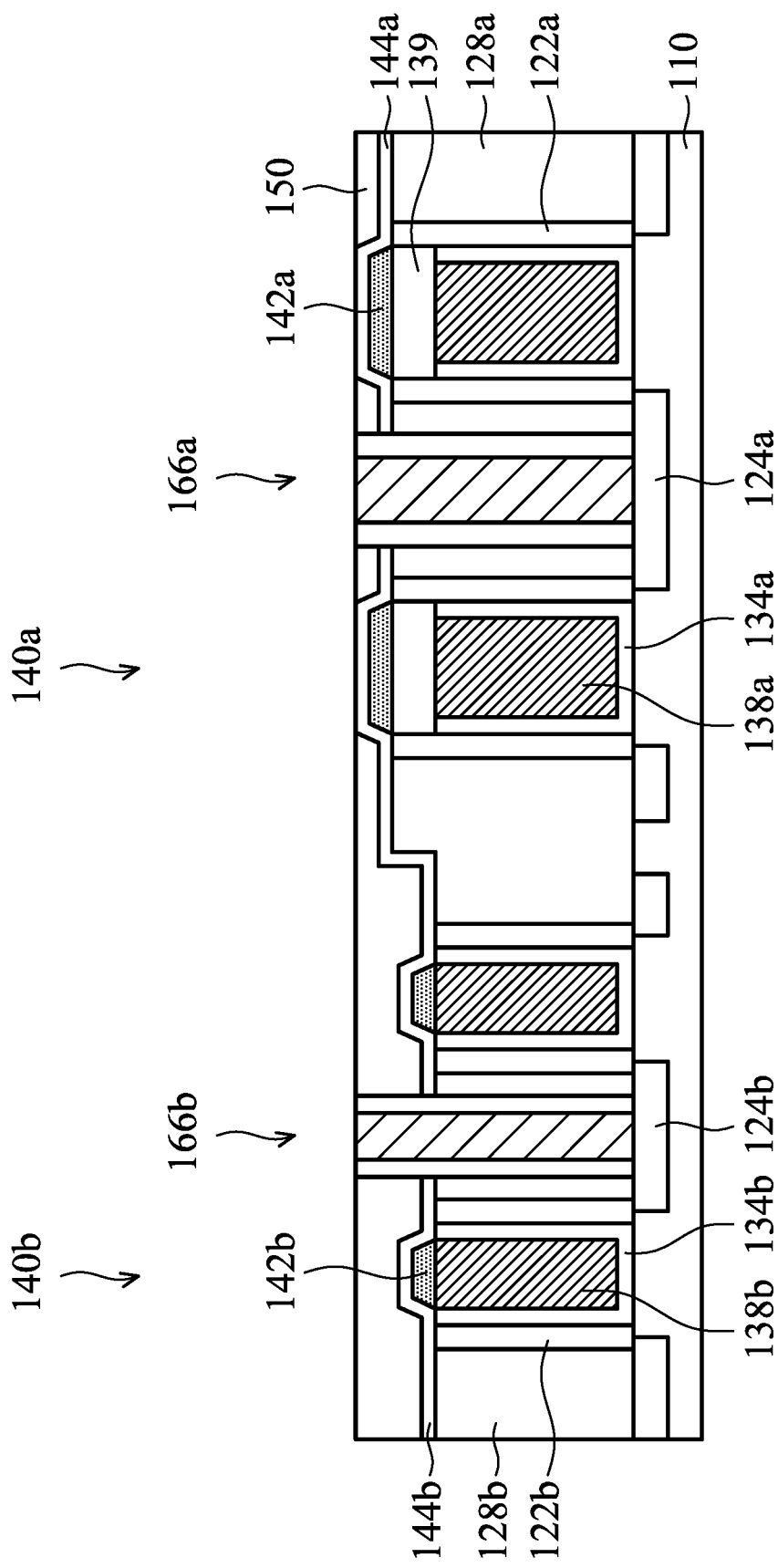

Subsequently, as shown in FIG. 2E, a portion of the conductive layer 164 out of the trenches is removed, and a portion of the dielectric layer 150 is removed to form the first S/D contact structure 166a in the first region 11 and the second S/D contact structure 166b in the second region 12. The first S/D contact structure 166a is electrically connected to the first S/D structure 124a, and the second S/D contact structure 166b is electrically connected to the second S/D structure 124b.

It should be noted that a polishing process is performed on the dielectric layer 150 (shown in FIG. 2D) on the first region 11 and the second region 12, a portion of the first gate structure 140a may be removed and exposed while the second portion of the dielectric layer 150 does not reach a predetermined depth. Therefore, the function of the first gate structure 140a may be degraded to decrease the performance of the FinFET device structure. The first capping layer 142a is configured to protect the first gate structure 140a.

Figure 3A:
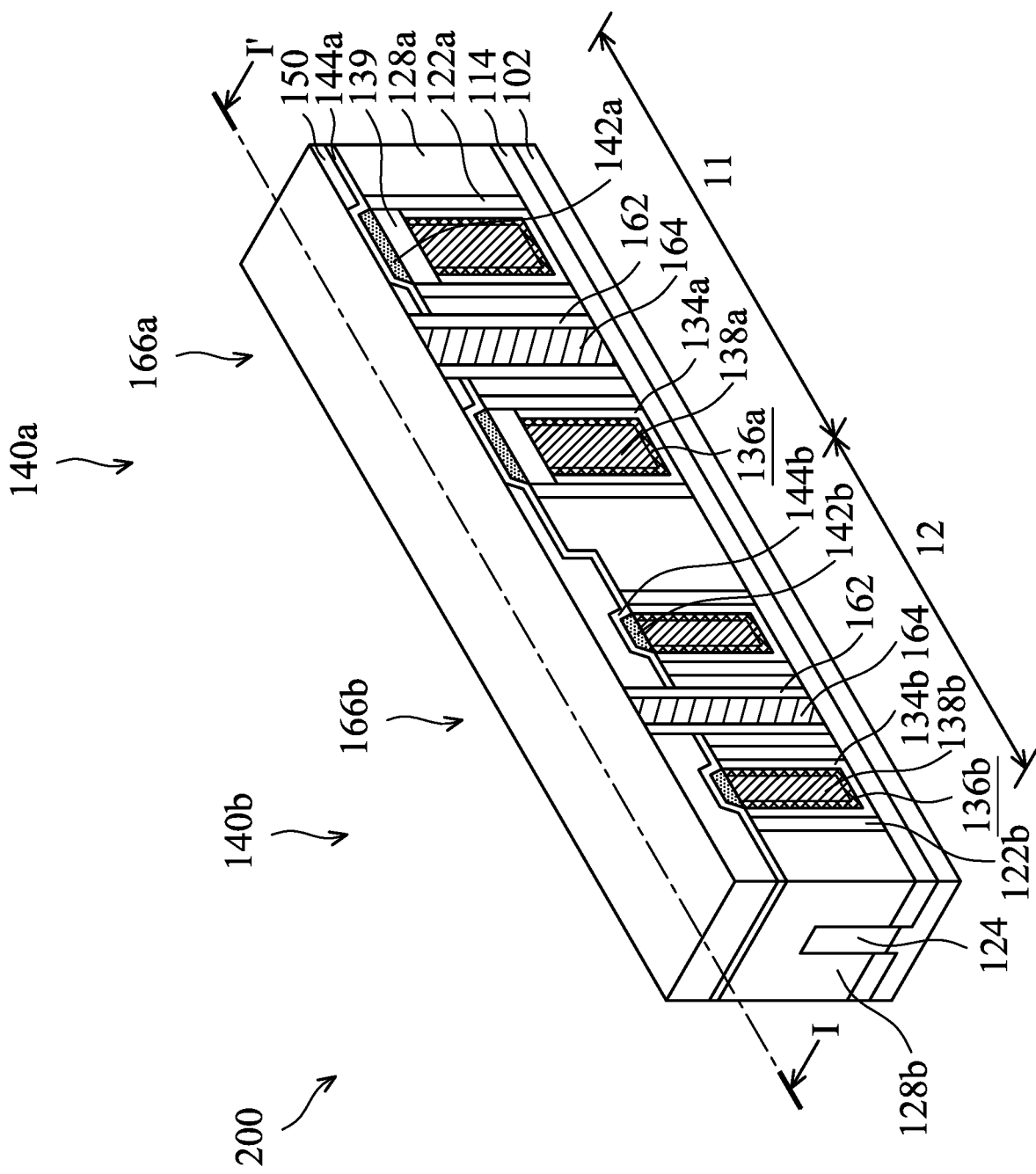
FIG. 3A shows a perspective representation of a FinFET device structure 200, in accordance with some embodiments of the disclosure.
Figure 3B:
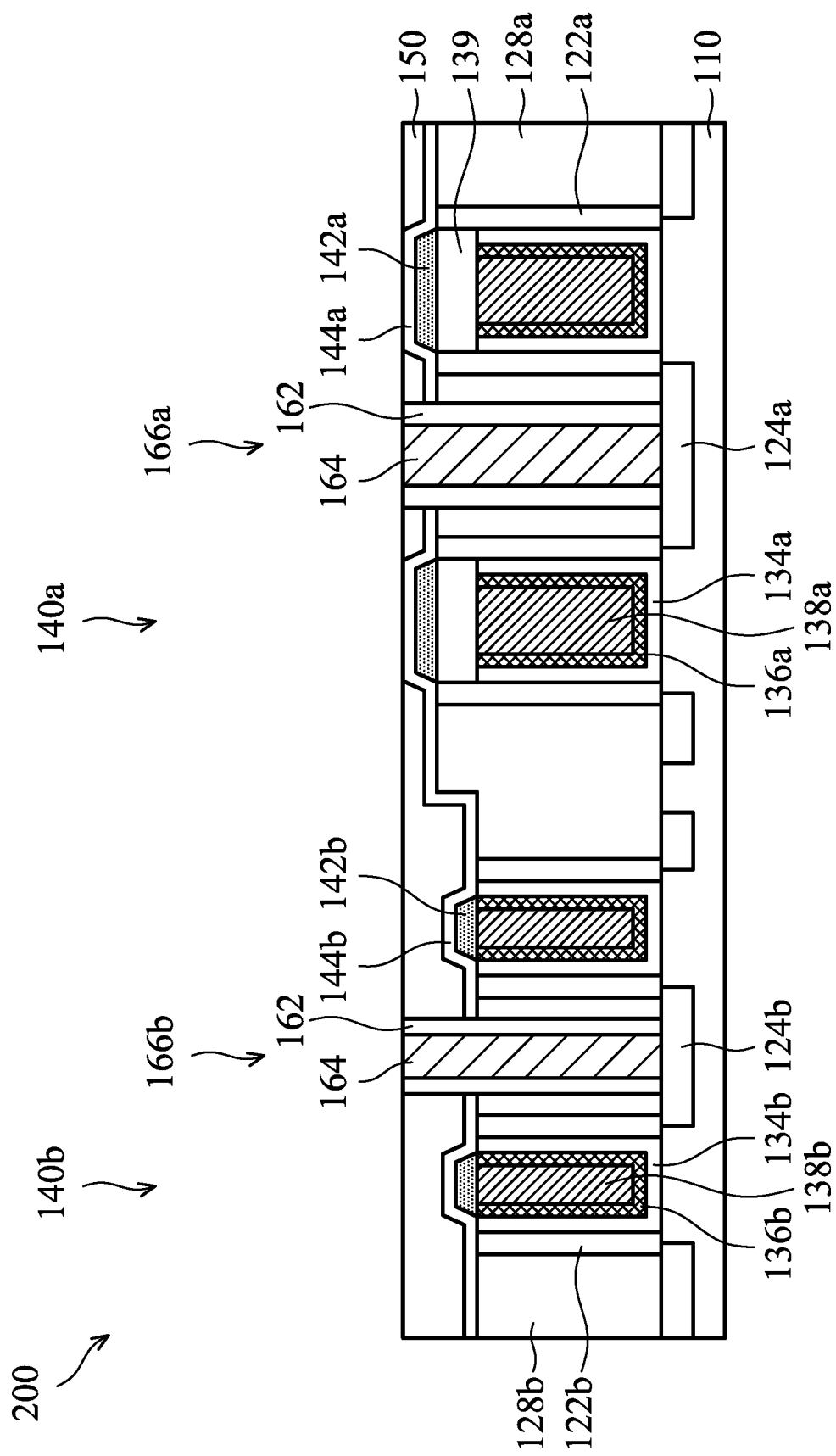
FIG. 3B is a cross-sectional representation taken along the line II' of FIG. 3A

FIG. 3A shows a cross-sectional representation of a FinFET device structure 200, in accordance with some embodiments of the disclosure. Some processes and materials used to form the FinFET device structure 200 are similar to, or the same as, those used to form the FinFET device structure 100 and are not repeated herein. FIG. 3B is a cross-sectional representation taken along the line II' of FIG. 3A.

As shown in FIGS. 3A and 3B, the first gate structure 140a further includes a first work function layer 136a between the first gate dielectric layer 134a and the first gate electrode layer 138a, and the second gate structure 140b further includes a second work function layer 136b between the second gate dielectric layer 134b and the second gate electrode layer 138b. It should be noted that the second capping layer 142a is not only formed on the second gate electrode layer 138b but also formed on the second work function layer 136b.

The work function layers 136a, 136b are independently made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru), or a combination thereof.

Figure 4A:
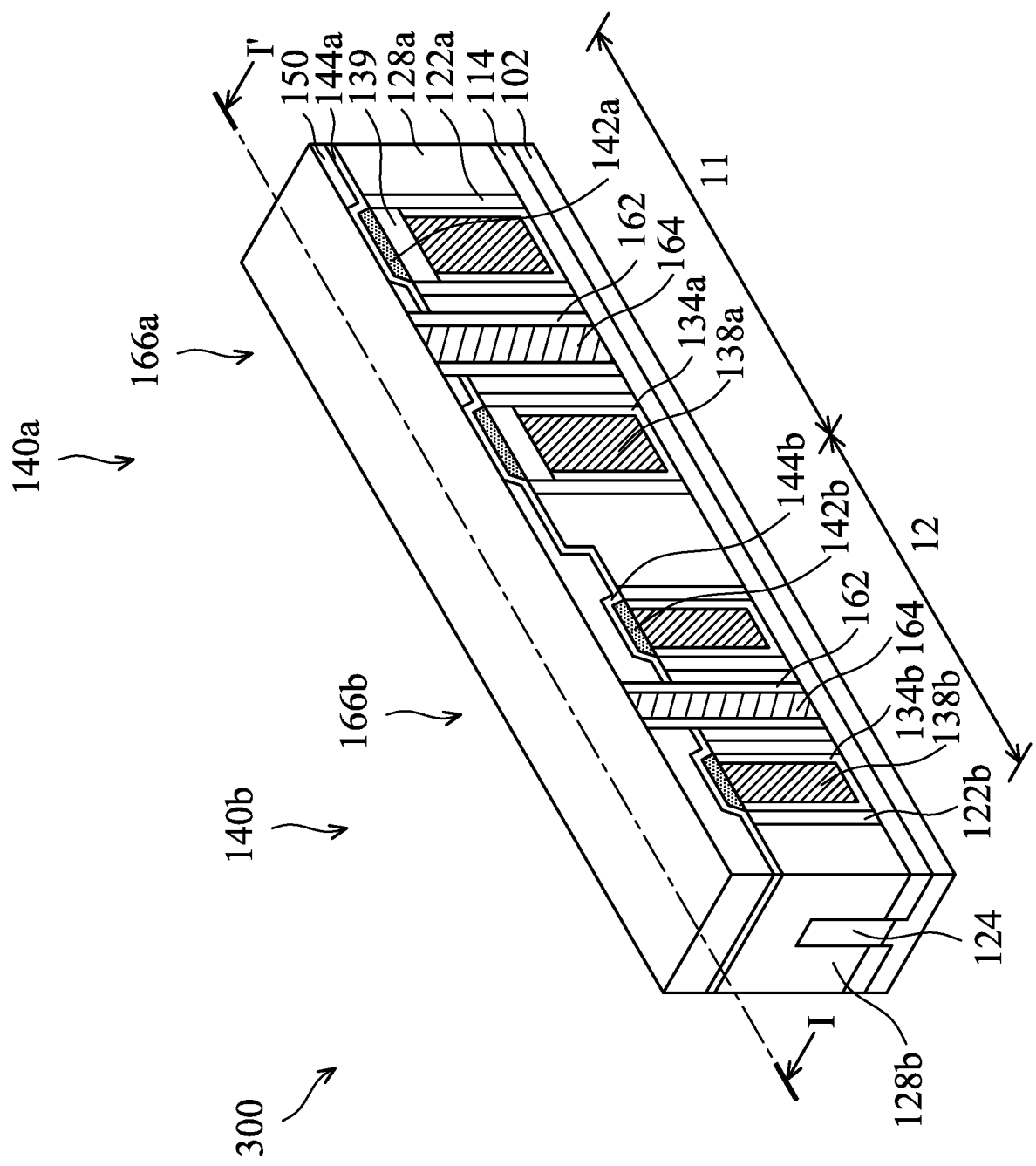
FIG. 4A shows a perspective representation of a FinFET device structure 200, in accordance with some embodiments of the disclosure.
Figure 4B:
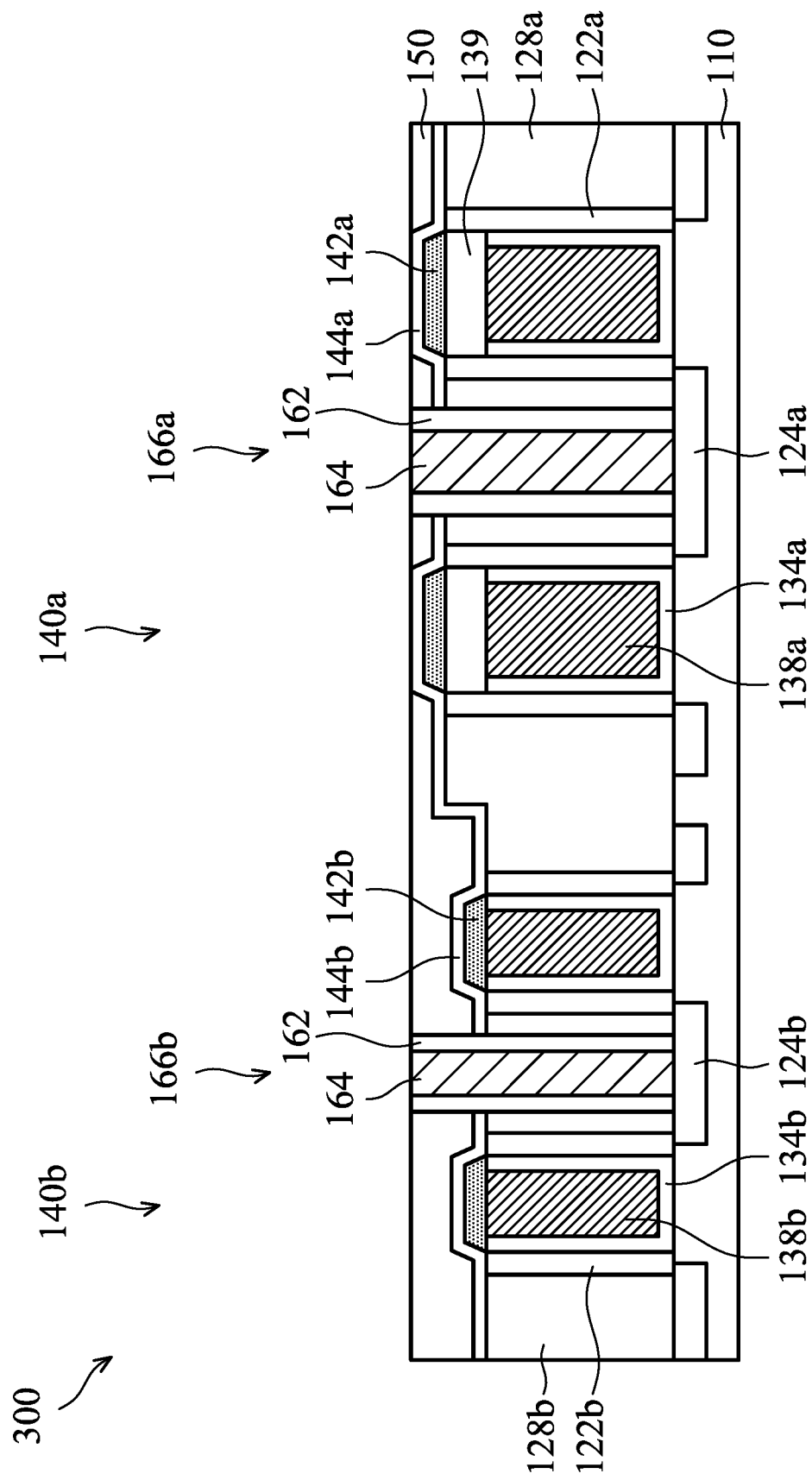
FIG. 4B is a cross-sectional representation taken along the line II' of FIG. 4A.

FIG. 4A shows a cross-sectional representation of a FinFET device structure 200, in accordance with some embodiments of the disclosure. Some processes and materials used to form the FinFET device structure 300 are similar to, or the same as, those used to form the FinFET device structure 100 and are not repeated herein. FIG. 4B is a cross-sectional representation taken along the line II' of FIG. 4A.

As shown in FIGS. 4A and 4B, the second capping layer 142b is not only formed on the second gate electrode layer 138b but also formed over the second gate dielectric layer 134b. It should be noted that the second capping layer 142b is not formed on the second gate spacer layer 122b and the second portion of the ILD layer 128.

Embodiments for forming a FinFET device structure and method for formation the same are provided. The FinFET device structure includes a substrate with a first region and a second region. A first gate structure with a first width is formed over the first region, and a second gate structure with a second width is formed over the second region, and the first width is greater than the second width. A first capping layer is selectively formed on the top surface of the first gate structure to protect the underlying layers from being removed or damaged. Therefore, the performance of the FinFET device structure is improved.

In some embodiments, a FinFET device structure is provided. The FinFET device structure includes a first gate structure formed over a fin structure, and a first capping layer formed over the first gate structure. The FinFET device structure includes a first etching stop layer formed over the first capping layer and the first gate structure, and a top surface and a sidewall surface of the first capping layer are in direct contact with the first etching stop layer.

In some embodiments, a FinFET device structure is provided. The FinFET device structure includes a first gate structure formed over a fin structure, and a second gate structure formed over the fin structure. The FinFET device structure includes an inter-layer dielectric (ILD) layer formed adjacent to the first gate structure and the second gate structure, and a first capping layer formed over the first gate structure. The FinFET device structure also includes a second capping layer formed over the second gate structure, and a first top surface of the first capping layer and a second top surface of the second capping layer both are higher than a third top surface of the ILD layer.

In some embodiments, a method for forming a FinFET device structure is provided. The method includes forming a fin structure over a substrate, and the substrate comprises a first region and a second region. The method includes forming a first gate structure over the fin structure in the first region, and forming a second gate structure over the fin structure in the second region. The method also includes forming a first capping layer over the first gate structure, and forming a first etching stop layer over the first capping layer. A sidewall surface of the first capping layer is in direct contact with the first etching stop layer.

In some embodiments, a FinFET device structure is provided. The FinFET device structure includes a first gate structure formed over a fin structure, and a conductive layer formed over the first gate structure. The FinFET device structure includes a first capping layer formed over the conductive layer, and a top surface of the conductive layer is in direct contact with a bottom surface of the first capping layer.

In some embodiments, a FinFET device structure is provided. The FinFET device structure includes a first gate structure formed over a fin structure, and a second gate structure formed over the fin structure. The FinFET device structure includes a first capping layer formed over the first gate structure, and a second capping layer formed over the second gate structure. A top surface of the first capping layer is higher than a top surface of the second capping layer.

In some embodiments, a FinFET device structure is provided. The FinFET device structure includes a first gate structure formed over a fin structure, and a first capping layer formed over the first gate structure. The FinFET device structure includes a first gate spacer layer formed on a sidewall of the first gate structure, and the first capping layer is not formed on the first gate spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a first gate structure formed over a fin structure;
    a first gate spacer layer formed on a sidewall of the first gate structure,
    a conductive layer formed over the first gate structure, wherein the conductive layer is lower than a top surface of the first gate spacer layer; and
    a first capping layer formed over the conductive layer, wherein a top surface of the conductive layer is in direct contact with a bottom surface of the first capping layer.

2. The fin field effect transistor (FinFET) device structure as claimed in claim 1, wherein the first capping layer is not formed on the first gate spacer layer.

3. The fin field effect transistor (FinFET) device structure as claimed in claim 1, wherein the first capping layer has a tapered width from a bottom surface to a top surface.

4. The fin field effect transistor (FinFET) device structure as claimed in claim 1, wherein a sidewall of the conductive layer is aligned with a sidewall of the first capping layer.

5. The fin field effect transistor (FinFET) device structure as claimed in claim 1, further comprising:
    a second gate structure formed over the fin structure; and
    a second capping layer formed over the second gate structure, wherein the top surface of the conductive layer is higher than a top surface of the second capping layer.

6. The fin field effect transistor (FinFET) device structure as claimed in claim 5, further comprising:
    an etching stop layer formed over the first capping layer and the second capping layer, wherein the etching stop layer has a step height.

7. The fin field effect transistor (FinFET) device structure as claimed in claim 5, wherein the first gate structure has a first width, the second gate structure has a second width, and the first width is greater than the second width.

8. The fin field effect transistor (FinFET) device structure as claimed in claim 1, further comprising:
    a first source/drain (S/D) structure formed over the fin structure; and
    a first source/drain (S/D) contact structure formed over the first S/D structure, wherein a top surface of the first S/D contact structure is higher than a top surface of the first capping layer.

9. The fin field effect transistor (FinFET) device structure as claimed in claim 1, wherein the first gate structure comprises:
    a first gate dielectric layer formed over the fin structure; and
    a first gate electrode layer formed over the first gate dielectric layer, wherein a sidewall of the conductive layer is aligned with a sidewall of the first gate dielectric layer.

10. A fin field effect transistor (FinFET) device structure, comprising:
    a first gate structure formed over a fin structure;
    a second gate structure formed over the fin structure;
    a first capping layer formed over the first gate structure; and a second capping layer formed over the second gate structure, wherein a top surface of the first capping layer is higher than a top surface of the second capping layer; and an inter-layer dielectric (ILD) layer formed adjacent to the first gate structure and the second gate structure, wherein the second capping layer is higher than a top surface of the ILD layer.

11. The fin field effect transistor (FinFET) device structure as claimed in claim 10, wherein the ILD layer has a step height.

12. The fin field effect transistor (FinFET) device structure as claimed in claim 10, further comprising:

a conductive layer between the first gate structure and the first capping layer, wherein a sidewall of the conductive layer is aligned with a sidewall of the first capping layer.

13. The fin field effect transistor (FinFET) device structure as claimed in claim 10, further comprising:

a first gate spacer layer formed on a sidewall of the first gate structure, wherein the first capping layer is not formed on the first gate spacer layer.

14. The fin field effect transistor (FinFET) device structure as claimed in claim 13, further comprising:

a second gate spacer layer formed on a sidewall of the second gate structure, wherein a top surface of the first gate spacer layer is higher than a top surface of the second gate spacer layer.

15. The fin field effect transistor (FinFET) device structure as claimed in claim 10, wherein the first capping layer has a top width and a bottom width greater than the top width.

16. The fin field effect transistor (FinFET) device structure as claimed in claim 10, wherein the first gate structure comprises:

a first gate dielectric layer formed over the fin structure; and a first gate electrode layer formed over the first gate dielectric layer, wherein a sidewall of the first gate dielectric layer is aligned with a sidewall of the first capping layer.

17. A fin field effect transistor (FinFET) device structure, comprising:

a first gate structure formed over a fin structure, wherein the first gate structure comprises a first gate dielectric layer and a first gate electrode layer over the first gate dielectric layer;

a first capping layer formed over the first gate structure, wherein the first capping layer is in direct contact with the first gate structure, wherein a sidewall of the first capping layer is aligned with a sidewall of the first gate electrode layer; and a first gate spacer layer formed on a sidewall of the first gate structure, wherein the first capping layer is not formed on the first gate spacer layer.

18. The fin field effect transistor (FinFET) device structure as claimed in claim 17, further comprising:

a second gate structure formed over the fin structure;

a second gate spacer layer formed on a sidewall of the second gate structure, a second capping layer formed over the second gate structure, wherein the second capping layer is not formed on the second gate spacer layer.

19. The fin field effect transistor (FinFET) device structure as claimed in claim 17, further comprising:

a first source/drain (S/D) structure formed over the fin structure; and a first source/drain (S/D) contact structure formed over the first S/D structure, wherein a top surface of the first S/D contact structure is higher than a top surface of the first capping layer.

20. The fin field effect transistor (FinFET) device structure as claimed in claim 17, wherein a top width of the first capping layer is greater than a top width of the second capping layer.

* * * * *